United States Patent
Ogawa et al.

(10) Patent No.: US 11,362,206 B2
(45) Date of Patent: Jun. 14, 2022

(54) NITRIDE SEMICONDUCTOR DEVICE

(71) Applicant: PANASONIC CORPORATION, Osaka (JP)

(72) Inventors: Masahiro Ogawa, Osaka (JP); Daisuke Shibata, Kyoto (JP); Satoshi Tamura, Osaka (JP)

(73) Assignee: PANASONIC CORPORATION, Osaka (JP)

( * ) Notice: Subject to any disclaimer, the term of this patent is extended or adjusted under 35 U.S.C. 154(b) by 137 days.

(21) Appl. No.: 17/021,676

(22) Filed: Sep. 15, 2020

(65) Prior Publication Data
US 2020/0411679 A1 Dec. 31, 2020

Related U.S. Application Data

(63) Continuation of application No. PCT/JP2019/007406, filed on Feb. 26, 2019.

(30) Foreign Application Priority Data

Mar. 22, 2018 (JP) .............................. JP2018-054381

(51) Int. Cl.
*H01L 29/778* (2006.01)
*H01L 29/20* (2006.01)

(52) U.S. Cl.
CPC ...... *H01L 29/7787* (2013.01); *H01L 29/2003* (2013.01); *H01L 29/7788* (2013.01); *H01L 29/7789* (2013.01)

(58) Field of Classification Search
CPC .................. H01L 29/7789; H01L 29/7788
See application file for complete search history.

(56) References Cited

U.S. PATENT DOCUMENTS

| 2004/0157355 | A1* | 8/2004 | Kachi | ................. | H01L 29/7786 257/E29.252 |
|---|---|---|---|---|---|
| 2012/0181548 | A1 | 7/2012 | Okada et al. | | |
| 2018/0097081 | A1* | 4/2018 | Cao | ..................... | H01L 29/4236 |

FOREIGN PATENT DOCUMENTS

| JP | 2011-082397 A | 4/2011 |
|---|---|---|
| JP | 5353735 B2 | 11/2013 |

OTHER PUBLICATIONS

Shibata, D. "1.7 kV /1.0 mΩcm2 Normally-off Vertical GaN Transistor on GaN substrate with Regrown p-GaN/AlGaN/GaN Semipolar Gate Structure" 2016 IEEE Int. Elec. dev. Meet. IEDM Feb. 2, 2017 pp. 248-251 (Year: 2017).*

(Continued)

*Primary Examiner* — Grant S Withers
(74) *Attorney, Agent, or Firm* — McDermott Will & Emery LLP

(57) ABSTRACT

A nitride semiconductor device includes: a substrate having a first main surface and a second main surface; a first nitride semiconductor layer of a first conductivity type provided above the first main surface; a second nitride semiconductor layer of a second conductivity type provided above the first nitride semiconductor layer; a first opening which penetrates through the second nitride semiconductor layer to the first nitride semiconductor layer; an electron transport layer provided above the second nitride semiconductor layer and on an inner surface of the first opening; a gate electrode provided above the electron transport layer and covering the first opening; a source electrode connected to the second nitride semiconductor layer; a drain electrode provided on a second main surface-side of the substrate; and a high-resistance layer provided between the second nitride semiconductor layer and the electron transport layer in the first opening, the high-resistance layer including a nitride semiconductor.

8 Claims, 11 Drawing Sheets

(56) References Cited

OTHER PUBLICATIONS

International Search Report and Written Opinion dated Jun. 4, 2019 in International Patent Application No. PCT/JP2019/007406; with partial English translation.

* cited by examiner

NITRIDE SEMICONDUCTOR DEVICE

CROSS REFERENCE TO RELATED APPLICATIONS

This application is a U.S. continuation application of PCT International Patent Application Number PCT/JP2019/007406 filed on Feb. 26, 2019, claiming the benefit of priority of Japanese Patent Application Number 2018-054381 filed on Mar. 22, 2018, the entire contents of which are hereby incorporated by reference.

BACKGROUND

1. Technical Field

The present disclosure relates to a nitride semiconductor device.

2. Description of the Related Art

Nitride semiconductors, such as gallium nitride (GaN), are wide-gap semiconductors which have large band-gaps, and feature greater breakdown fields and higher electron saturated drift velocities than gallium arsenide (GaAs) semiconductors, silicon (Si) semiconductors, and the like. As such, power transistors using nitride semiconductors, which are useful in achieving higher outputs and breakdown voltages, are being researched and developed.

For example, Japanese Unexamined Patent Application Publication No. 2011-82397 discloses a semiconductor device formed on a GaN-type layered body. The semiconductor device described in Japanese Unexamined Patent Application Publication No. 2011-82397 is a vertical field effect transistor (FET) including a regrowth layer positioned so as to cover an opening formed in the GaN-type layered body and a gate electrode positioned on the regrowth layer so as to follow the regrowth layer. A channel is formed by two-dimensional electron gas (2DEG) produced by the regrowth layer, and thus a FET with high mobility and a low on-resistance is achieved.

SUMMARY

In a vertical field effect transistor, the gate electrode and the source electrode are provided close to each other, and there is thus a risk that leakage current will flow between the gate and source.

Accordingly, the present disclosure provides a nitride semiconductor device that suppresses leakage current.

To solve the aforementioned problem, a nitride semiconductor device according to an aspect of the present disclosure includes: a substrate having a first main surface and a second main surface which face in opposite directions; a first nitride semiconductor layer of a first conductivity type provided above the first main surface; a second nitride semiconductor layer of a second conductivity type provided above the first nitride semiconductor layer, the second conductivity type being different from the first conductivity type; a first opening which penetrates through the second nitride semiconductor layer to the first nitride semiconductor layer; an electron transport layer provided above the second nitride semiconductor layer and on an inner surface of the first opening; a gate electrode provided above the electron transport layer and covering the first opening; a source electrode connected to the second nitride semiconductor layer; a drain electrode provided on a second main surface-side of the substrate; and a high-resistance layer provided between the second nitride semiconductor layer and the electron transport layer in the first opening, the high-resistance layer including a nitride semiconductor and having a higher resistance value than the second nitride semiconductor layer.

According to the present disclosure, a nitride semiconductor device that suppresses leakage current can be provided.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS

Overview of the Present Disclosure

Figure 1:
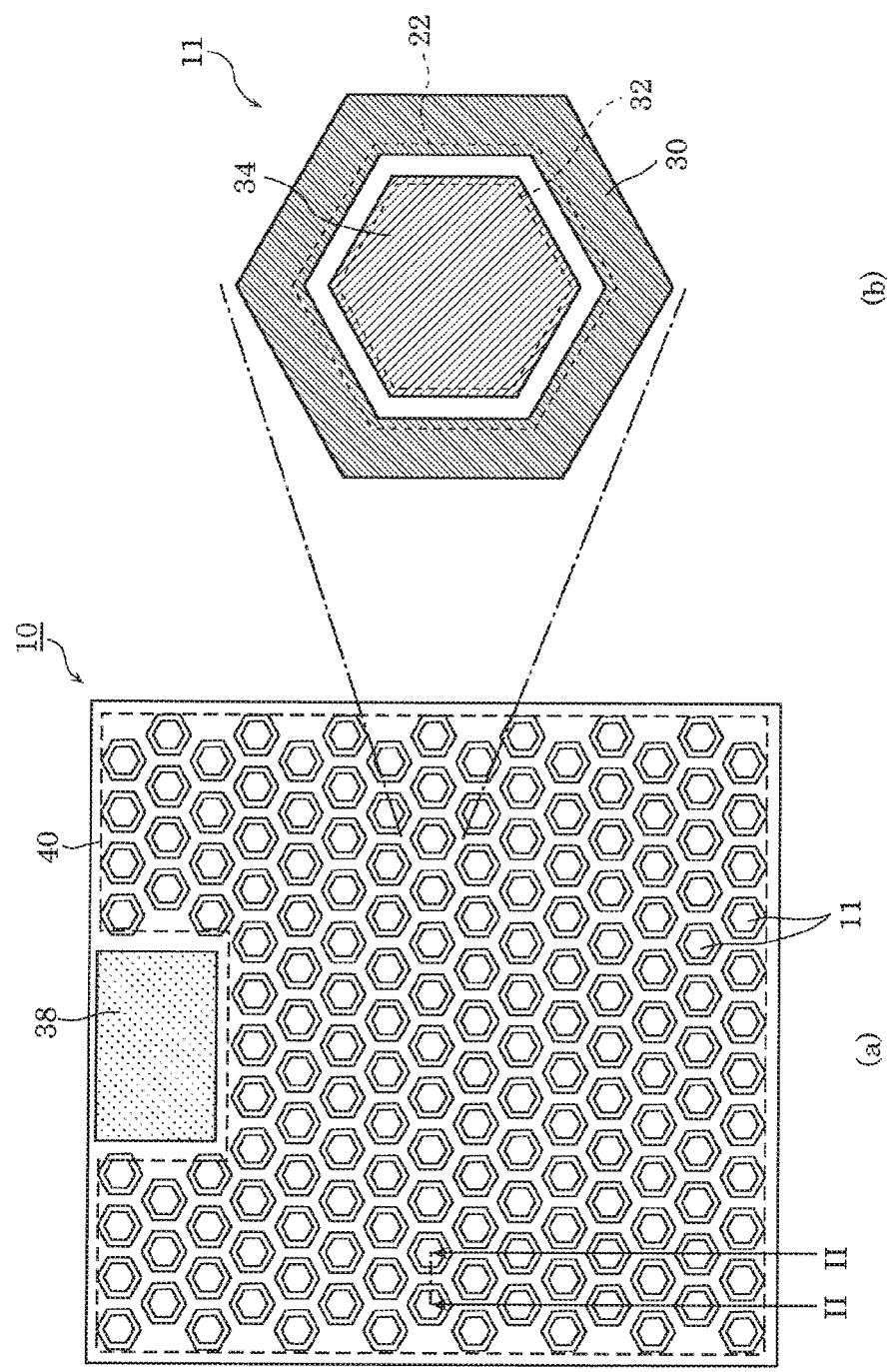
FIG. 1 is a plan view illustrating the planar layout of a nitride semiconductor device according to Embodiment 1.

To solve the aforementioned problem, a nitride semiconductor device according to an aspect of the present disclosure includes: a substrate having a first main surface and a second main surface which face in opposite directions; a first nitride semiconductor layer of a first conductivity type provided above the first main surface; a second nitride semiconductor layer of a second conductivity type provided above the first nitride semiconductor layer, the second conductivity type being different from the first conductivity type; a first opening which penetrates through the second nitride semiconductor layer to the first nitride semiconductor layer; an electron transport layer provided above the second nitride semiconductor layer and on an inner surface of the first opening; a gate electrode provided above the electron transport layer and covering the first opening; a source electrode connected to the second nitride semiconductor layer; a drain electrode provided on a second main surface-side of the substrate; and a high-resistance layer provided between the second nitride semiconductor layer and the electron transport layer in the first opening, the high-resistance layer including a nitride semiconductor and having a higher resistance value than the second nitride semiconductor layer.

Accordingly, the high-resistance layer is provided between the second nitride semiconductor layer and the electron transport layer, and thus leakage current flowing from the source electrode to the gate electrode via the second nitride semiconductor layer and the electron transport layer is suppressed by the high-resistance layer. For example, the high-resistance layer functions as an insulating layer, which substantially blocks the path of the leakage current and makes it possible to greatly reduce the leakage current. Thus according to this aspect, a nitride semiconductor device which suppresses leakage current is provided.

Here, for example, the high-resistance layer may contain iron.

By having the nitride semiconductor contain iron, the resistance of the high-resistance layer can be increased, which makes it possible to suppress leakage current even more. Furthermore, the high-resistance layer can be formed with ease in a desired region and with a desired shape through ion implantation or the like. For example, the crystalline structure of the nitride semiconductor breaks down in regions where iron ions are implanted, which makes it possible to increase the resistance in that region. The resistance value and shape of the high-resistance layer can be adjusted precisely by using ion implantation, which makes it possible to increase the reliability of the leakage current suppression effect.

Additionally, for example, the high-resistance layer may contain carbon.

By having the nitride semiconductor contain carbon, a high-resistance layer having a higher resistance than a nitride semiconductor which does not contain impurities is formed, and thus leakage current can be reduced. For example, a nitride semiconductor containing carbon can be formed with ease in a desired region and at a uniform thickness through regrowth.

Additionally, for example, a carbon concentration of the high-resistance layer may be higher than a carbon concentration of the electron transport layer.

Through this, the higher the carbon concentration is, the higher the resistance of the high-resistance layer can be made. The leakage current suppression effect can therefore be increased.

Additionally, for example, the first opening may include a bottom part and a side wall part, and the high-resistance layer may extend from the side wall part to a part of the bottom part.

Through this, the high-resistance layer is provided extending from the side wall part of the inner surface of the first opening to a part of the bottom part, and thus a situation where an electrical field concentrates at a boundary part between the side wall part and the bottom part can be suppressed. By suppressing the electrical field concentration, the breakdown voltage of the nitride semiconductor device can be increased.

Additionally, for example, a nitride semiconductor device according to an aspect of the present disclosure may further include a third nitride semiconductor layer provided between the gate electrode and the electron transport layer and having the second conductivity type.

Through this, the carrier concentration directly below the gate electrode can be reduced by the third nitride semiconductor layer, which makes it possible to shift the threshold voltage of the nitride semiconductor device toward the positive side. Accordingly, the nitride semiconductor device according to this aspect can be implemented as a normally-off FET.

Additionally, for example, when the substrate is viewed in plan view, an end part of the gate electrode is located at a position closer to the source electrode than an end part of the first opening.

The controllability of the channel formed by the regrowth layer can be improved as a result.

Additionally, for example, a nitride semiconductor device according to an aspect of the present disclosure may further include a second opening at a position distanced from the gate electrode, the second opening penetrating through the electron transport layer to the second nitride semiconductor layer; and the source electrode may be provided in the second opening.

Accordingly, a barrier layer can be formed near the interface between the second nitride semiconductor layer and the first nitride semiconductor layer by a voltage applied between the source electrode and the drain electrode. Forming the barrier layer makes it possible to suppress the occurrence of leakage current between the source and drain. The breakdown voltage of the nitride semiconductor device can therefore be increased.

Embodiments of the present disclosure will be described hereinafter with reference to the drawings.

Note that the following embodiments describe comprehensive or specific examples of the present disclosure. The numerical values, shapes, materials, constituent elements, arrangements and connection states of constituent elements, steps, orders of steps, and the like in the following embodiments are merely examples, and are not intended to limit the present disclosure. Additionally, of the constituent elements in the following embodiments, constituent elements not denoted in the independent claims will be described as optional constituent elements.

Additionally, the drawings are schematic diagrams, and are not necessarily exact illustrations. As such, the scales and so on, for example, are not necessarily consistent from drawing to drawing. Furthermore, configurations that are substantially the same are given the same reference signs in the drawings, and redundant descriptions will be omitted or simplified.

Additionally, in the present specification, terms indicating relationships between elements, such as "parallel" or "perpendicular", terms indicating the shapes of elements, such as "rectangular" or "circular", and numerical value ranges do not express the items in question in the strictest sense, but rather include substantially equivalent ranges, e.g., differences of several percent, as well.

Additionally, in the present specification, terms such as "above" and "below" do not indicate the upward direction (vertically upward) and the downward direction (vertically downward) in an absolute spatial sense, but rather are used as terms defining relative positional relationships based on layering orders in layered structures. In the present specification, relative to a substrate, a side on which a gate electrode, a source electrode, and so on are provided will be referred to as "upward", and a side on which a drain electrode is provided will be referred to as "downward". Moreover, terms such as "above" and "below" are used not only in cases where two constituent elements are disposed with an interval therebetween and another constituent element is present between the stated two constituent elements, but also in cases where two constituent elements are disposed in close contact with each other.

In the present specification, "AlGaN" refers to an $Al_xGa_{1-x}N$ ternary mixed crystal (where $0 \leq x \leq 1$). Hereinafter, for multidimensional mixed crystals, the arrangements of the respective constituent elements are abbreviated, e.g., AlInN and GaInN. For example, $Al_xGa_{1-x-y}In_yN$ (where $0 \leq x \leq 1$, $0 \leq y \leq 1$, and $x+y \leq 1$), which is a nitride semiconductor, is abbreviated as "AlGaInN".

Embodiment 1

Configuration

First, the configuration of a nitride semiconductor device according to Embodiment 1 will be described with reference to FIGS. 1 and 2.

FIG. 1 is a plan view illustrating the planar layout of nitride semiconductor device 10 according to the present embodiment. FIG. 2 is a cross-sectional view of nitride semiconductor device 10 according to the present embodiment.

Here, (a) in FIG. 1 is a plan view of nitride semiconductor device 10 seen from above. (b) in FIG. 1 illustrates a single unit cell 11 of nitride semiconductor device 10 in an enlarged manner. FIG. 2 illustrates a cross-section of nitride semiconductor device 10 according to the present embodiment from line II-II in FIG. 1.

As indicated in (a) of FIG. 1, nitride semiconductor device 10 includes a plurality of unit cells 11. The plurality of unit cells 11 are provided in a two-dimensional layout. Each of the plurality of unit cells 11 has the same configuration. Seen in plan view, each unit cell 11 is hexagonal in shape. The plurality of unit cells 11 are arranged so that, when seen in plan view, the centers of the plurality of unit cells 11 are located at the vertices of regular hexagons arranged so as to fill in the area of the device.

Unit cell 11 is configured around a single source electrode 34. FIG. 2 illustrates a cross-section taken from the line II-II, which passes through the centers of two adjacent unit cells 11.

Figure 2:
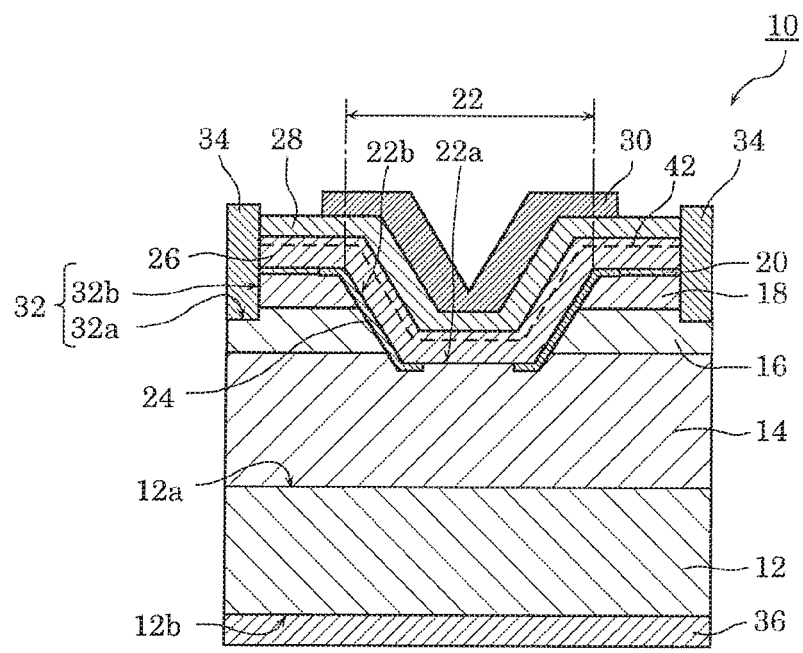
FIG. 2 is a cross-sectional view of the nitride semiconductor device according to Embodiment 1.

As illustrated in FIG. 2, nitride semiconductor device 10 includes substrate 12, drift layer 14, first base layer 16, second base layer 18, third base layer 20, gate opening 22, high-resistance layer 24, electron transport layer 26, electron supply layer 28, gate electrode 30, source opening 32, source electrode 34, and drain electrode 36. Nitride semiconductor device 10 further includes gate electrode pad 38 and source electrode pad 40, as illustrated in (a) of FIG. 1. Note that in (a) of FIG. 1, the perimeter of source electrode pad 40 is schematically indicated by a broken line.

Nitride semiconductor device 10 is a device having a layered structure of semiconductor layers that take a nitride semiconductor such as GaN or AlGaN as a primary component. Specifically, nitride semiconductor device 10 has a heterostructure of an AlGaN film and a GaN film.

In the heterostructure of an AlGaN film and a GaN film, highly-concentrated two-dimensional electron gas (2DEG) 42 is produced at the hetero interface due to spontaneous polarization or piezoelectric polarization on a c plane represented by a (0001) plane. The device therefore has a characteristic where a sheet carrier concentration of $1 \times 10^{13}$ $cm^{-2}$ or more is achieved at the interface, even in an undoped state.

Nitride semiconductor device 10 according to the present embodiment is a field effect transistor (FET) which uses two-dimensional electron gas 42 produced at the AlGaN/GaN hetero interface as a channel. Specifically, nitride semiconductor device 10 is what is known as a vertical FET.

Substrate 12 is a substrate constituted by a nitride semiconductor, and as illustrated in FIG. 2, has first main surface 12a and second main surface 12b which face in opposite directions. First main surface 12a is a main surface on a side where drift layer 14 is formed. Specifically, first main surface 12a substantially coincides with the c plane. Second main surface 12b is a main surface on a side where drain electrode 36 is formed. Seen in plan view, the shape of substrate 12 is a rectangle, for example, but the shape is not limited thereto.

Substrate 12 is, for example, a substrate formed from n-type GaN with a thickness of 300 μm and a carrier concentration of $1 \times 10^{18}$ $cm^{-3}$. Note that "n-type" and "p-type" indicate conductivity types of semiconductors. In the present embodiment, "n-type" is an example of a first conductivity type of a nitride semiconductor. "p-type" is an example of a second conductivity type having a different polarity from the first conductivity type.

Drift layer 14 is an example of a first nitride semiconductor layer having the first conductivity type, and is provided above first main surface 12a of substrate 12. Drift layer 14 is, for example, a film formed from n-type GaN with a thickness of 8 μm and a carrier concentration of $1 \times 10^{16}$ $cm^{-3}$. Drift layer 14 is provided so as to be in contact with first main surface 12a of substrate 12.

First base layer 16 is an example of a second nitride semiconductor layer having the second conductivity type, which is different from the first conductivity type, and is provided above drift layer 14. First base layer 16 is, for example, a film formed from p-type GaN with a thickness of 400 nm and a carrier concentration of $1 \times 10^{17}$ $cm^{-3}$. First base layer 16 is provided so as to be in contact with an upper surface of drift layer 14.

First base layer 16 suppresses leakage current between source electrode 34 and drain electrode 36. For example, when a reverse voltage is applied to a pn junction formed by first base layer 16 and drift layer 14, and more specifically, when drain electrode 36 is at a higher potential than source electrode 34, a barrier layer extends along drift layer 14. This makes it possible to increase the breakdown voltage of nitride semiconductor device 10.

Second base layer 18 is disposed on first base layer 16. Second base layer 18 is formed from an insulative or semi-insulative nitride semiconductor. Second base layer 18 is, for example, a film formed from undoped GaN having a thickness of 200 nm. Second base layer 18 is provided so as to be in contact with first base layer 16.

Note that "undoped" means that the material is not doped with a dopant such as silicon (Si) or magnesium (Mg), which changes the polarity of GaN to n-type or p-type. In the present embodiment, second base layer 18 is doped with carbon. Specifically, second base layer 18 has a higher carbon concentration than first base layer 16.

Additionally, second base layer 18 may contain silicon (Si) or oxygen (O) which intermix during film formation. In this case, the carbon concentration of second base layer 18 is lower than the silicon concentration or the oxygen concentration. For example, the carbon concentration of second base layer 18 is $3\times10^{17}$ cm$^{-3}$ or more, but may be $1\times10^{18}$ cm$^{-3}$ or more. The silicon concentration or oxygen concentration of second base layer 18 is $5\times10^{16}$ cm$^{-3}$ or less, but may be $2\times10^{16}$ cm$^{-3}$ or less.

Here, if nitride semiconductor device 10 does not include second base layer 18, a layered structure of the n-type electron supply layer 28, electron transport layer 26, and third base layer 20, the p-type first base layer 16, and the n-type drift layer 14 is present between source electrode 34 and drain electrode 36. This layered structure corresponds to a parasitic bipolar transistor having a parasitic npn structure.

If, when nitride semiconductor device 10 is off, current flows in first base layer 16, the parasitic bipolar transistor will turn on, and the breakdown voltage of nitride semiconductor device 10 may drop as a result. In this case, nitride semiconductor device 10 is more likely to malfunction.

Second base layer 18 prevents this parasitic npn structure from being formed. Accordingly, malfunctions in nitride semiconductor device 10 caused by the parasitic npn structure being formed can be reduced.

Third base layer 20 is disposed on second base layer 18. Third base layer 20 is, for example, a film formed from $Al_{0.2}Ga_{0.8}N$ having a thickness of 20 nm. Third base layer 20 is provided so as to be in contact with second base layer 18.

Third base layer 20 suppresses the dispersion of p-type impurities such as Mg from first base layer 16. If Mg has dispersed as far as a channel within electron transport layer 26, there is a risk that the carrier concentration of two-dimensional electron gas 42 will drop and the on-resistance will rise. Note that the degree to which Mg disperses differs depending on conditions of epitaxial growth and the like as well. Accordingly, if Mg dispersion is already suppressed, nitride semiconductor device 10 need not include third base layer 20.

Additionally, third base layer 20 may have a function for supplying electrons to a channel formed at an interface between electron transport layer 26 and electron supply layer 28. Third base layer 20 has a greater band-gap than electron supply layer 28, for example.

Gate opening 22 is an example of a first opening which penetrates through first base layer 16 to drift layer 14. Specifically, gate opening 22 penetrates from an upper surface of third base layer 20, through third base layer 20, second base layer 18, and first base layer 16 in that order, and reaches as far as drift layer 14. Bottom part 22a of gate opening 22 corresponds to the upper surface of drift layer 14. In the present embodiment, bottom part 22a of gate opening 22 is positioned lower than an interface between drift layer 14 and first base layer 16, as illustrated in FIG. 2.

In the present embodiment, gate opening 22 is formed so that the area of the opening increases with distance from substrate 12. Specifically, side wall part 22b of gate opening 22 is inclined at an angle. For example, the cross-sectional shape of gate opening 22 is an inverted trapezoid, and more specifically, an inverted isosceles trapezoid. Note that in (b) of FIG. 1, the contour of an upper end of gate opening 22 is indicated by a broken line. A contour of bottom part 22a of gate opening 22 is slightly smaller than the contour indicated in (b) of FIG. 1.

High-resistance layer 24 is provided between first base layer 16 and electron transport layer 26 in gate opening 22. In the present embodiment, high-resistance layer 24 is provided across side wall part 22b, and part of bottom part 22a, of gate opening 22. Specifically, high-resistance layer 24 is provided extending from an upper end part of gate opening 22, i.e., a part of an upper surface of third base layer 20, to part of bottom part 22a, so as to cover the entire surface of side wall part 22b. In other words, high-resistance layer 24 is provided between first base layer 16 and electron transport layer 26, between second base layer 18 and electron transport layer 26, and between third base layer 20 and electron transport layer 26.

To be more specific, an upper surface of an upper end part of high-resistance layer 24 is flush with the upper surface of third base layer 20, as illustrated in FIG. 2. Additionally, an upper surface of a lower end part of high-resistance layer 24 is flush with a part of the upper surface of drift layer 14 which forms bottom part 22a. High-resistance layer 24 is formed so as to be embedded in a surface layer part and an end surface part of third base layer 20, an end surface part of second base layer 18, an end surface part of first base layer 16, and a surface layer part of drift layer 14.

High-resistance layer 24 has a higher resistance value than first base layer 16. In the present embodiment, high-resistance layer 24 has a higher resistance value than second base layer 18.

High-resistance layer 24 is constituted by a nitride semiconductor. In the present embodiment, high-resistance layer 24 contains iron (Fe). High-resistance layer 24 is, for example, constituted by GaN which is doped with iron and has an increased resistance. High-resistance layer 24 is 50 nm thick, for example.

Electron transport layer 26 is a first regrowth layer provided above first base layer 16 and on an inner surface of gate opening 22. Specifically, electron transport layer 26 is formed on the upper surface of third base layer 20, and side wall part 22b and bottom part 22a of gate opening 22, at a substantially uniform thickness. Electron transport layer 26 is, for example, a film formed from undoped GaN having a thickness of 100 nm.

Electron transport layer 26 makes contact with drift layer 14 at bottom part 22a of gate opening 22. Electron transport layer 26 makes contact with high-resistance layer 24 at side wall part 22b of gate opening 22. Furthermore, electron transport layer 26 makes contact with the upper surface of third base layer 20.

Electron transport layer 26 has a channel. Specifically, two-dimensional electron gas 42 is produced near the interface between electron transport layer 26 and electron supply layer 28. Two-dimensional electron gas 42 functions as the channel of electron transport layer 26. In FIG. 2, two-dimensional electron gas 42 is schematically indicated by a broken line. Although undoped here, electron transport layer 26 may be given n-type conductivity by being doped with Si or the like.

Additionally, although not illustrated here, in the present embodiment, an approximately 1 nm-thick AlN film is provided, as a second regrowth layer, between electron transport layer 26 and electron supply layer 28. The AlN film suppresses alloy scattering, which makes it possible to improve channel mobility.

Electron supply layer 28 is a third regrowth layer provided above first base layer 16 and on an inner surface of gate opening 22. Note that electron transport layer 26 and electron supply layer 28 are provided in that order from the substrate 12 side. Electron supply layer 28 is formed on an upper surface of electron transport layer 26 at a substantially uniform thickness. Electron supply layer 28 is, for example, a film formed from undoped $Al_{0.2}Ga_{0.8}N$ having a thickness of 50 nm.

Electron supply layer 28 forms an AlGaN/GaN hetero interface with electron transport layer 26, with a 1 nm-thick AlN film interposed therebetween. Two-dimensional electron gas 42 is produced within electron transport layer 26 as a result.

Electron supply layer 28 supplies electrons to the channel formed in electron transport layer 26 (i.e., to two-dimensional electron gas 42). Note that as described above, in the present embodiment, third base layer 20 also has a function of supplying electrons. Both electron supply layer 28 and third base layer 20 are formed from AlGaN, but the Al composition ratio is not particularly limited at this time. For example, the Al composition ratio of electron supply layer 28 may be 20%, and the Al composition ratio of third base layer 20 may be 25%.

Gate electrode 30 is provided above electron transport layer 26, so as to cover gate opening 22. In the present embodiment, gate electrode 30 is formed on the upper surface of electron supply layer 28 and in contact with the upper surface of electron supply layer 28, and is formed at a substantially uniform thickness.

Gate electrode 30 is formed using a conductive material such as a metal. Gate electrode 30 is formed using palladium (Pd), for example. Note that a material which is Schottky-connected to an n-type semiconductor can be used as the material of gate electrode 30, and thus a nickel (Ni)-based material, tungsten silicide (WSi), gold (Au), or the like can be used, for example.

Seen in plan view, gate electrode 30 is formed at a distance from source electrode 34 so as not to make contact with source electrode 34. Specifically, as illustrated in (b) of FIG. 1, gate electrode 30 is provided so as to surround source electrode 34, when seen in plan view. To be more specific, gate electrode 30 is formed as a single sheet in which a plurality of openings, each corresponding to the hexagonal source electrode 34, are provided.

In the present embodiment, when seen in plan view, end parts of gate electrode 30 are located at positions closer to source electrode 34 than end parts of gate opening 22. Specifically, seen in plan view, gate opening 22 is provided on an inner side of gate electrode 30.

Source opening 32 is an example of a second opening which penetrates through electron transport layer 26 to first base layer 16 at a position distanced from gate electrode 30. Specifically, source opening 32 penetrates through electron supply layer 28, electron transport layer 26, third base layer 20, and second base layer 18 in that order, and reaches as far as first base layer 16. In the present embodiment, bottom part 32a of source opening 32 corresponds to an upper surface of first base layer 16, as illustrated in FIG. 2. Bottom part 32a is positioned lower than an interface between first base layer 16 and second base layer 18. Seen in plan view, source opening 32 is disposed in a location distanced from gate opening 22.

As illustrated in FIG. 2, source opening 32 is formed so that the area of the opening is substantially constant. Specifically, side wall part 32b of source opening 32 is substantially parallel to a thickness direction of substrate 12. For example, the cross-sectional shape of source opening 32 is a rectangle. Alternatively, the cross-sectional shape of source opening 32 may be an inverted trapezoid, like gate opening 22.

In the present embodiment, seen in plan view, the shape of source opening 32 is a regular hexagon, as illustrated in (b) of FIG. 1. A distance from gate electrode 30, which is provided so as to surround the perimeter of source opening 32, is substantially constant. Side wall part 32b of source opening 32 has a {1-100} plane. Here, "{1-100} plane" is a collective term for a (1-100) plane and a plane equivalent to a (1-100) plane.

Source electrode 34 is provided in source opening 32. Specifically, source electrode 34 is provided so as to fill the inside of source opening 32.

Source electrode 34 is connected to first base layer 16. Specifically, source electrode 34 is connected to an end surface of each of electron supply layer 28, electron transport layer 26, third base layer 20, and second base layer 18. Source electrode 34 makes ohmic contact with electron transport layer 26 and electron supply layer 28.

Source electrode 34 is formed using a conductive material such as a metal. For example, a material which makes ohmic contact with an n-type semiconductor layer, such as Ti/Al, can be used as the material of source electrode 34.

The potential of first base layer 16 can be fixed by connecting source electrode 34 to first base layer 16. This makes it possible to stabilize the operations of nitride semiconductor device 10.

Additionally, Al is Schottky-connected to first base layer 16, which is constituted by a p-type nitride semiconductor. Accordingly, a metal material having a high work function, and which has a low contact resistance with respect to the p-type nitride semiconductor, such as Pd or Ni, may be provided on a lower layer part of source electrode 34. This makes it possible to further stabilize the potential of first base layer 16.

Drain electrode 36 is provided on the second main surface 12b side of substrate 12. Specifically, drain electrode 36 is provided so as to be in contact with second main surface 12b. Drain electrode 36 is formed using a conductive material such as a metal. For example, like source electrode 34, a material which makes ohmic contact with an n-type semiconductor layer, such as Ti/Al, can be used as the material of drain electrode 36.

Gate electrode pad 38 is electrically connected to gate electrode 30. Gate electrode pad 38 is provided above gate electrode 30, for example. In the present embodiment, gate electrode 30 is formed in the shape of a single sheet, and thus gate electrode pad 38 is provided only in a region corresponding to part of nitride semiconductor device 10 as seen in plan view, as illustrated in (a) of FIG. 1. A power source for controlling gate electrode 30 is connected to gate electrode pad 38.

Source electrode pad 40 is electrically connected to each of a plurality of source electrodes 34. Source electrode pad 40 is provided above source electrode 34. In the present embodiment, each of the plurality of source electrodes 34 is formed having a hexagonal island shape. Accordingly, seen in plan view, source electrode pad 40 is provided so as to cover the plurality of source electrodes 34, in a region that corresponds to most of nitride semiconductor device 10 but excludes gate electrode pad 38.

As described thus far, in nitride semiconductor device 10 according to the present embodiment, the interface between electron transport layer 26 and electron supply layer 28 is an AlGaN/GaN hetero interface. Accordingly, two-dimensional electron gas 42 is produced within electron transport layer 26, and a channel is formed as a result. Two-dimensional electron gas 42 has a high carrier concentration, which increases the channel mobility and reduces on-resistance.

Additionally, in the present embodiment, high-resistance layer 24 is provided between electron transport layer 26 and first base layer 16, which makes it possible to suppress leakage current traveling from source electrode 34 to gate electrode 30 through first base layer 16 and electron transport layer 26. As such, according to the present embodiment, nitride semiconductor device 10 which suppresses leakage current is realized.

Figure 3:
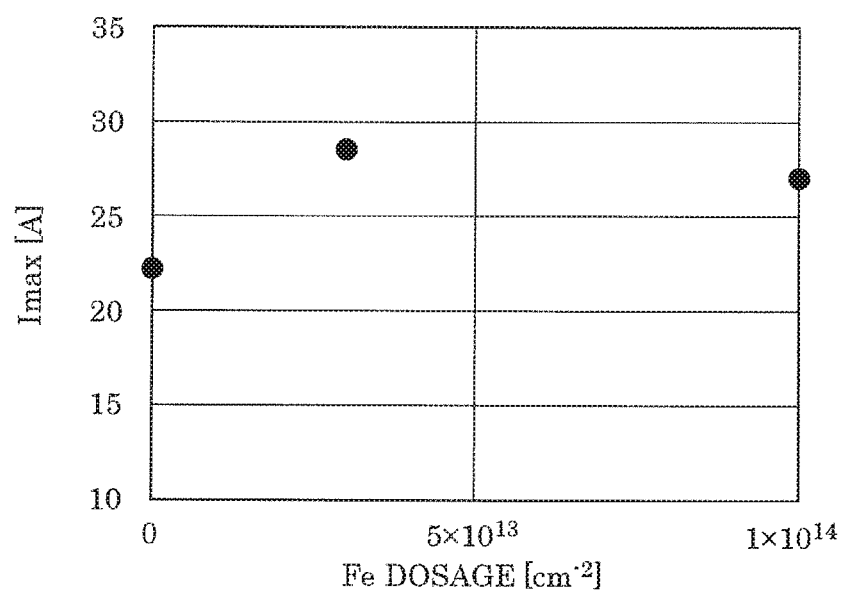
FIG. 3 is a chart illustrating a relationship between an Fe dosage amount in a high-resistance layer and a value of current flowing in a channel, in the nitride semiconductor device according to Embodiment 1.

FIG. 3 is a chart illustrating a relationship between an Fe dosage amount in high-resistance layer 24 and a value of current flowing in a channel, in nitride semiconductor device 10 according to the present embodiment. In FIG. 3, the horizontal axis represents the Fe dosage amount of high-resistance layer 24 (unit: $cm^{-2}$), and the vertical axis represents a maximum value Imax of drain current flowing in the channel when a predetermined voltage is applied (unit: A).

As illustrated in FIG. 3, when no Fe is added to high-resistance layer 24, i.e., if the Fe dosage amount is 0, the maximum value Imax of the drain current is approximately 22 A. On the other hand, when Fe is added to high-resistance layer 24, and specifically, when the Fe dosage amount is $3\times10^{13}$ $cm^{-2}$ and $1\times10^{14}$ $cm^{-2}$, the maximum value Imax of the drain current takes on a value of approximately 27 A to 29 A. Therefore, it can be seen that increasing the resistance value of high-resistance layer 24 by adding Fe to high-resistance layer 24 increases the maximum value Imax of drain current by approximately 1.2 times. In other words, providing high-resistance layer 24 makes it possible to increase the current of nitride semiconductor device 10.

Manufacturing Method

A method of manufacturing nitride semiconductor device 10 according to the present embodiment will be described next with reference to FIGS. 4A to 4G. FIGS. 4A to 4G are cross-sectional views illustrating respective processes in the method of manufacturing nitride semiconductor device 10 according to the present embodiment.

The following will describe an example in which each nitride semiconductor layer constituting nitride semiconductor device 10 is formed through metalorganic vapor-phase epitaxy (MOVPE). Note, however, that the method of forming the nitride semiconductor layers is not limited thereto, and the layers may be formed through molecular beam epitaxy (MBE) instead, for example.

Additionally, the n-type nitride semiconductor is formed by adding silicon (Si), for example. The p-type nitride semiconductor is formed by adding magnesium (Mg). Note, however, that the n-type impurity and the p-type impurity are not limited thereto.

Figure 4A:
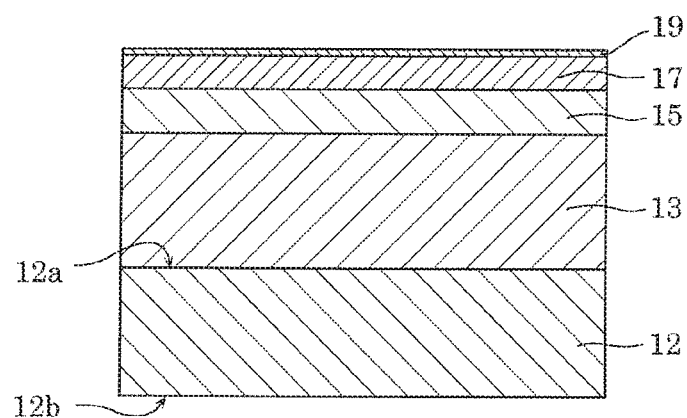
FIG. 4A is a cross-sectional view illustrating a process of layering a nitride semiconductor in a method of manufacturing the nitride semiconductor device according to Embodiment 1.

First, substrate 12, in which first main surface 12a is constituted by n-type GaN corresponding to a (0001) plane, i.e., a c plane, is prepared. As illustrated in FIG. 4A, n-type GaN film 13 in which Si is added as an n-type impurity, p-type GaN film 15 in which Mg is added is added as a p-type impurity, undoped GaN film 17, and undoped AlGaN film 19 constituted by undoped $Al_{0.2}Ga_{0.8}N$ are formed in that order on first main surface 12a of substrate 12. Note that n-type GaN film 13, p-type GaN film 15, undoped GaN film 17, and undoped AlGaN film 19 will be patterned into predetermined shapes to become drift layer 14, first base layer 16, second base layer 18, and third base layer 20 illustrated in FIG. 2, respectively.

The thicknesses and carrier concentrations of the layers are as follows, for example. n-type GaN film 13 is 8 μm thick and has a carrier concentration of $1\times10^{16}$ $cm^{-3}$. p-type GaN film 15 is 400 nm thick and has a carrier concentration of $1\times10^{17}$ $cm^{-3}$. Undoped GaN film 17 is 200 nm thick. Undoped AlGaN film 19 is 20 nm thick. Note, however, that these numerical values are merely examples.

Figure 4B:
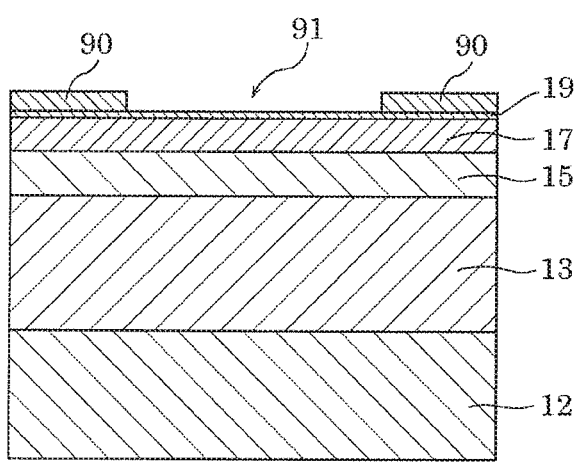
FIG. 4B is a cross-sectional view illustrating a process of patterning a resist in the method of manufacturing the nitride semiconductor device according to Embodiment 1.

As illustrated in FIG. 4B, resist mask 90 is formed by forming a resist on undoped AlGaN film 19 and then patterning the resist through photolithography. Resist mask 90 is a mask for forming gate opening 22, and has opening 91 corresponding to the shape of gate opening 22 as seen in plan view.

Figure 4C:
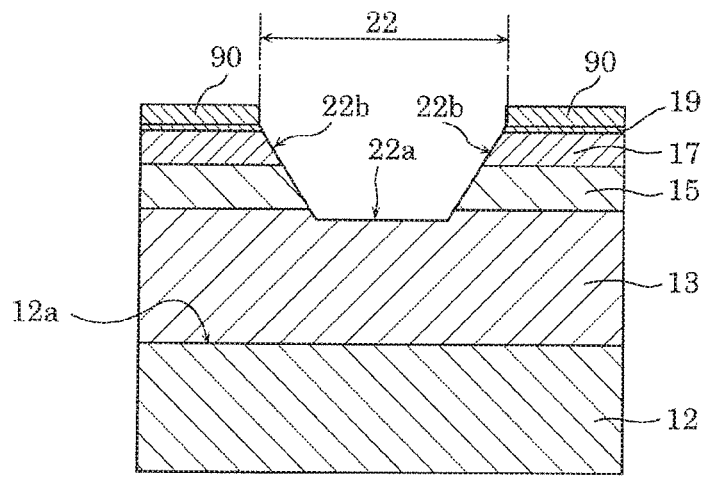
FIG. 4C is a cross-sectional view illustrating a process of forming a gate opening in the method of manufacturing the nitride semiconductor device according to Embodiment 1.

Next, as illustrated in FIG. 4C, gate opening 22 is formed through dry etching. Gate opening 22 penetrates through undoped AlGaN film 19, undoped GaN film 17, and p-type GaN film 15, and exposes n-type GaN film 13. At this time, bottom part 22a of gate opening 22 is parallel to first main surface 12a of substrate 12. Side wall part 22b of gate opening 22 is inclined relative to bottom part 22a at a predetermined angle of slope. The angle of slope is in a range of, for example, from 20° to 80° inclusive. Accordingly, a regrowth layer can be formed at a uniform thickness on side wall part 22b, which suppresses channel narrowing and makes it possible to suppress both a decrease in carrier concentration and an increase in on-resistance.

Figure 4D:
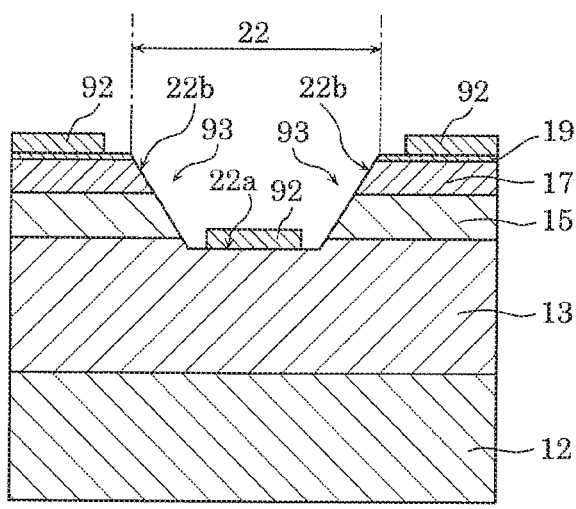
FIG. 4D is a cross-sectional view illustrating a process of patterning a resist for a mask used during ion implanting, in the method of manufacturing the nitride semiconductor device according to Embodiment 1.

Next, after resist mask 90 has been removed, a resist is once again formed on undoped AlGaN film 19 and within gate opening 22. As illustrated in FIG. 4D, resist mask 92 is formed by using photolithography to pattern the resist which has been formed.

Resist mask 92 is a mask for forming high-resistance layer 24. Resist mask 92 has opening 93, which is larger than side wall part 22b of gate opening 22. Opening 93 is provided from part of an upper surface of undoped AlGaN film 19 to part of bottom part 22a, from an upper end of side wall part 22b, so that at least side wall part 22b is exposed when seen in plan view.

Figure 4E:
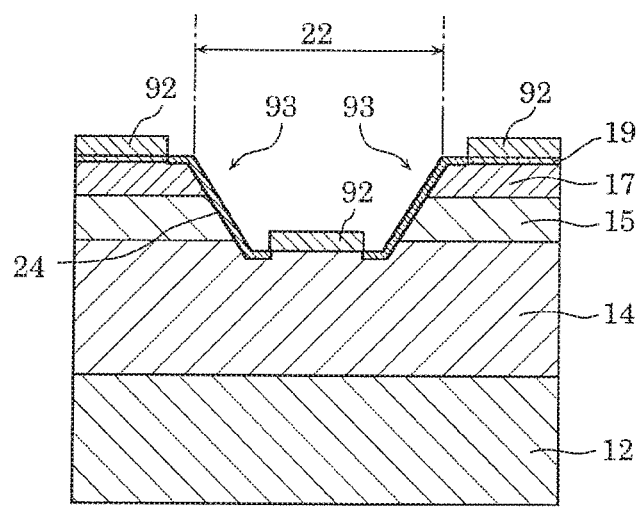
FIG. 4E is a cross-sectional view illustrating an ion implanting process in the method of manufacturing the nitride semiconductor device according to Embodiment 1.

Next, high-resistance layer 24 is formed as illustrated in FIG. 4E by implanting iron ions in the parts exposed by opening 93 in resist mask 92. High-resistance layer 24 is a layer in which the parts of undoped AlGaN film 19, undoped GaN film 17, p-type GaN film 15, and n-type GaN film 13 exposed by opening 93 are doped with iron. Note that the part of n-type GaN film 13 excluding high-resistance layer 24 corresponds to drift layer 14.

The ion implanting conditions are, for example, an acceleration energy of 40 keV and a dosage amount of $1\times10^{14}$ $cm^{-2}$. Through this, high-resistance layer 24 is formed at a thickness of approximately 50 nm. The region in which iron ions are implanted, i.e., high-resistance layer 24, has an increased resistance due to the breakdown of the crystalline structure.

At this time, ions of a metal having a higher atomic number, e.g., titanium ions, chromium ions, copper ions, or nickel ions, may be used instead of iron ions. This suppresses recrystallization of high-resistance layer 24 caused by thermal treatment in later processes, which increases the resistance value of high-resistance layer 24.

Figure 4F:
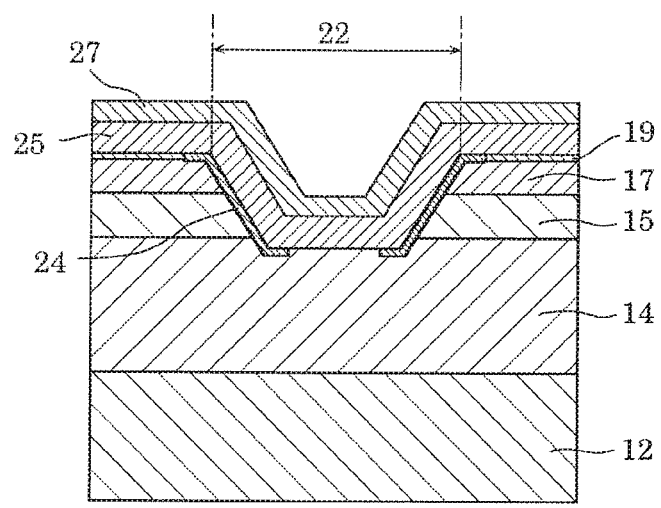
FIG. 4F is a cross-sectional view illustrating a nitride semiconductor regrowth process in the method of manufacturing the nitride semiconductor device according to Embodiment 1.

Next, after resist mask 92 has been removed, undoped GaN film 25, an undoped AlN film (not shown), and undoped AlGaN film 27 are formed, in that order, through MOVPE, across the entire surface of and following the shape of, gate opening 22, as illustrated in FIG. 4F. Undoped GaN film 25 and undoped AlGaN film 27 are patterned into predetermined shapes to become electron transport layer 26 and electron supply layer 28, respectively.

The layers have substantially uniform thicknesses, which are as follows, for example. Undoped GaN film 25 is 100 nm thick. Undoped AlN film is 1 nm thick. Undoped AlGaN film 27 is 50 nm thick. Note, however, that these numerical values are merely examples.

Note that high-resistance layer 24 is formed from a nitride semiconductor, and thus the film properties provided by the regrowth of undoped GaN film 25, the undoped AlN film (not shown), and undoped AlGaN film 27 are improved.

Figure 4G:
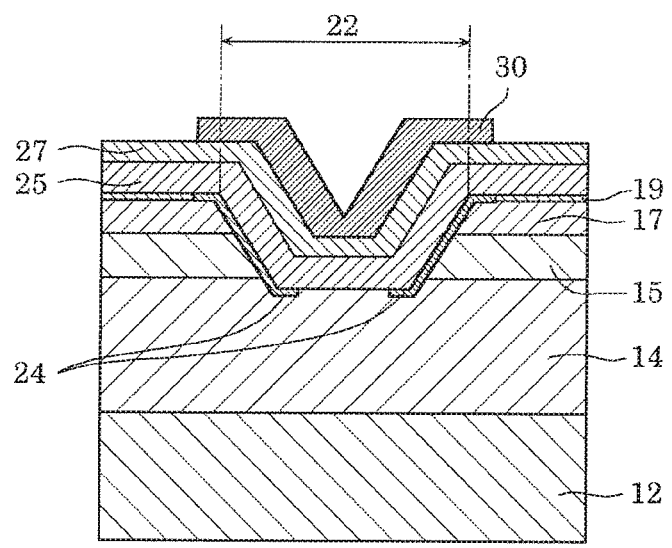
FIG. 4G is a cross-sectional view illustrating a process of forming a gate electrode in the method of manufacturing the nitride semiconductor device according to Embodiment 1.

Next, a gate metal film constituted by Pd is formed through vapor deposition or sputtering so as to cover gate opening 22. As illustrated in FIG. 4G, gate electrode 30 is formed by patterning the gate metal film which has been formed.

Furthermore, source opening 32, which penetrates through undoped AlGaN film 27, the undoped AlN film (not shown), undoped GaN film 25, undoped AlGaN film 19, and undoped GaN film 17, and reaches as far as p-type GaN film 15, is formed in a location distanced from gate electrode 30. Like gate opening 22, source opening 32 is formed through photolithography and dry etching. Electron supply layer 28, electron transport layer 26, third base layer 20, second base layer 18, and first base layer 16 are formed by patterning undoped AlGaN film 27, undoped GaN film 25, undoped AlGaN film 19, undoped GaN film 17, and p-type GaN film 15, respectively.

Next, source electrode 34 is formed by forming a source metal film constituted by Ti and Au through vapor deposition or sputtering so as to fill source opening 32 and then patterning the source metal film. Furthermore, drain electrode 36 is formed by forming a drain metal film constituted by Ti and Al on second main surface 12b of substrate 12 through vapor deposition or sputtering and then patterning the drain metal film as necessary.

Nitride semiconductor device 10 illustrated in FIG. 2 is formed through the processes described above.

Note that after gate electrode 30 and source electrode 34 have been formed, an insulating film is formed, and contact holes which expose parts of the plurality of source electrodes 34 and part of gate electrode 30 are then formed in the insulating film which has been formed. Gate electrode pad 38 and source electrode pad 40 are then formed by forming and patterning metal films.

Variation

A variation on nitride semiconductor device 10 according to the present embodiment will be described next with reference to FIG. 5.

Figure 5:
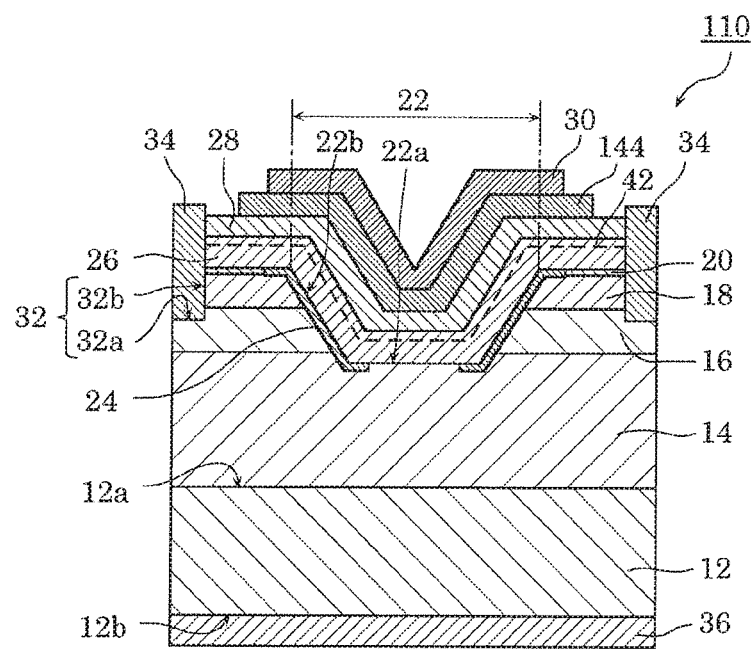
FIG. 5 is a cross-sectional view of a nitride semiconductor device according to a variation on Embodiment 1.

FIG. 5 is a cross-sectional view of nitride semiconductor device 110 according to the present variation. As illustrated in FIG. 5, nitride semiconductor device 110 differs from nitride semiconductor device 10 illustrated in FIG. 2 in that threshold control layer 144 is provided. The following descriptions will focus on the differences from the embodiment, and descriptions of common points will be omitted or simplified.

Threshold control layer 144 is an example of a third nitride semiconductor layer of the second conductivity type, provided between gate electrode 30 and electron transport layer 26. Threshold control layer 144 is provided on electron supply layer 28, and makes contact with electron supply layer 28 and gate electrode 30.

In the present variation, when substrate 12 is seen in plan view, end parts of threshold control layer 144 are located at positions closer to source electrode 34 than the end parts of gate electrode 30. Threshold control layer 144 and source electrode 34 are distanced from, and do not make contact with, each other.

Threshold control layer 144 is, for example, a nitride semiconductor layer formed from p-type GaN with a thickness of 100 nm and a carrier concentration of $1 \times 10^{17}$ cm$^{-3}$. Threshold control layer 144 is formed through MOVPE and patterning, after forming undoped AlGaN film 27 which forms electron supply layer 28.

According to the present variation, threshold control layer 144 increases the potential at the end of the conducting band of the channel part. This makes it possible to increase the threshold voltage of nitride semiconductor device 110. Accordingly, nitride semiconductor device 110 can be implemented as a normally-off FET.

Embodiment 2

Embodiment 2 will be described next. The following descriptions will focus on the differences from Embodiment 1, and descriptions of common points will be omitted or simplified.

Configuration

Figure 6:
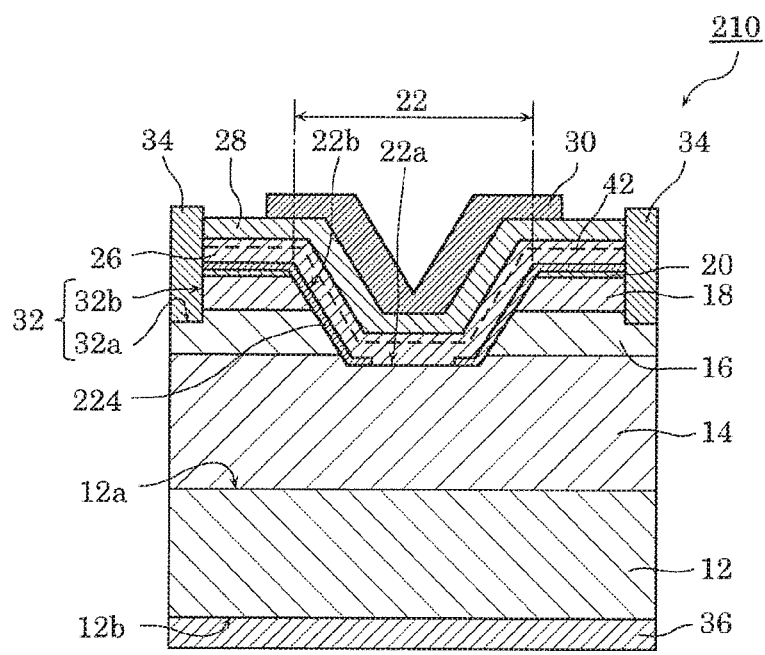
FIG. 6 is a cross-sectional view of a nitride semiconductor device according to Embodiment 2.

First, the configuration of a nitride semiconductor device according to the present embodiment will be described with reference to FIG. 6. FIG. 6 is a cross-sectional view of nitride semiconductor device 210 according to the present embodiment.

As illustrated in FIG. 6, nitride semiconductor device 210 according to the present embodiment differs from nitride semiconductor device 10 according to Embodiment 1 in that high-resistance layer 224 is provided instead of high-resistance layer 24. High-resistance layer 224 is formed through a different method from high-resistance layer 24 according to Embodiment 1.

Note that the shapes and sizes of drift layer 14, first base layer 16, second base layer 18, third base layer 20, and electron transport layer 26 may differ from those of Embodiment 1 due to the different method being used to form high-resistance layer 224. However, those layers will not be described below.

High-resistance layer 224 is provided between first base layer 16 and electron transport layer 26 in gate opening 22. In the present embodiment, high-resistance layer 224 is provided across side wall part 22b, and part of bottom part 22a, of gate opening 22. Specifically, high-resistance layer 224 is provided covering the entire upper surface of third base layer 20, as well as extending from an upper end of gate opening 22 to part of bottom part 22a so as to cover the entire surface of side wall part 22b. In other words, high-resistance layer 224 is provided between first base layer 16 and electron transport layer 26, between second base layer 18 and electron transport layer 26, and between third base layer 20 and electron transport layer 26. End parts of high-resistance layer 224 are exposed in source opening 32 and make contact with source electrode 34.

High-resistance layer 224 has a higher resistance value than first base layer 16. In the present embodiment, high-resistance layer 224 has a higher resistance value than second base layer 18.

High-resistance layer 224 is constituted by a nitride semiconductor. In the present embodiment, high-resistance layer 224 contains carbon (C). The carbon concentration of high-resistance layer 224 is higher than, for example, the carbon concentration of electron transport layer 26. For example, the carbon concentration of high-resistance layer 224 is $2 \times 10^{18}$ cm$^{-3}$. As opposed to this, the carbon concentration of electron transport layer 26 is, for example, $2 \times 10^{16}$ cm$^{-3}$. High-resistance layer 224 is 50 nm thick, for example. The higher the carbon concentration in high-resistance layer 224 is, the higher the resistance of high-resistance layer 224 can be made.

As described thus far, in nitride semiconductor device 210 according to the present embodiment, high-resistance layer 224 is provided between electron transport layer 26 and first base layer 16, which makes it possible to suppress leakage current traveling from source electrode 34 to gate electrode through first base layer 16 and electron transport layer 26, in the same manner as in Embodiment 1. As such, according to the present embodiment, nitride semiconductor device 210 which suppresses leakage current is realized.

Manufacturing Method

A method of manufacturing nitride semiconductor device 210 according to Embodiment 2 will be described next with reference to FIGS. 7A to 7E. FIGS. 7A to 7E are cross-sectional views illustrating respective processes in the method of manufacturing nitride semiconductor device 210 according to the present embodiment.

The method of manufacturing nitride semiconductor device 210 according to the present embodiment is the same as the method of manufacturing nitride semiconductor device 10 according to Embodiment 1 in terms of the processes for forming gate opening 22, which have been described with reference to FIGS. 4A to 4C.

Figure 7A:
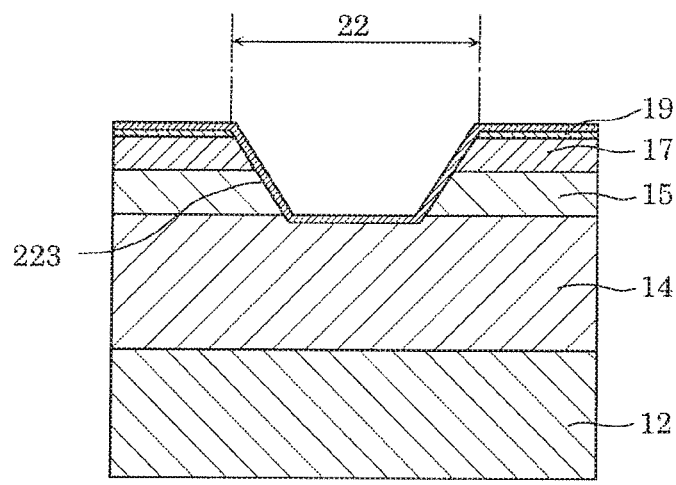
FIG. 7A is a cross-sectional view illustrating a process of forming a high-resistance layer in a method of manufacturing the nitride semiconductor device according to Embodiment 2.

In the present embodiment, once gate opening 22 has been formed and resist mask 90 (see FIG. 4C) has been removed. GaN film 223, which has a high carbon concentration, is formed through MOVPE on undoped AlGaN film 19 and within gate opening 22, as illustrated in FIG. 7A. GaN film 223 is 50 nm thick and has a carbon concentration of $2 \times 10^{18}$ cm$^{-3}$, for example.

Note that the degree of carbon concentration is controlled by, for example, adjusting the raw materials used for MOVPE. For example, trimethylgallium is used to form the GaN film. By capturing a high number of methyl group carbon atoms contained in the trimethylgallium into the GaN film, the carbon concentration of the GaN film can be increased. For example, the carbon concentration can be increased by lowering the crystal growth temperature or increasing the raw material amount.

Figure 7B:
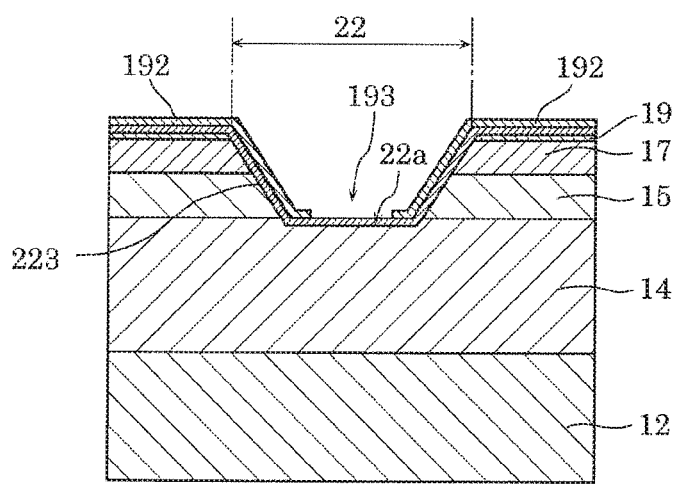
FIG. 7B is a cross-sectional view illustrating a process of patterning a resist in the method of manufacturing the nitride semiconductor device according to Embodiment 2.

Next, as illustrated in FIG. 7B, resist mask 192 is formed by forming a resist on GaN film 223 and then patterning the resist through photolithography.

Resist mask 192 is a mask for forming high-resistance layer 224 by patterning GaN film 223. Resist mask 192 has opening 193, which is smaller than bottom part 22a of gate opening 22.

Figure 7C:
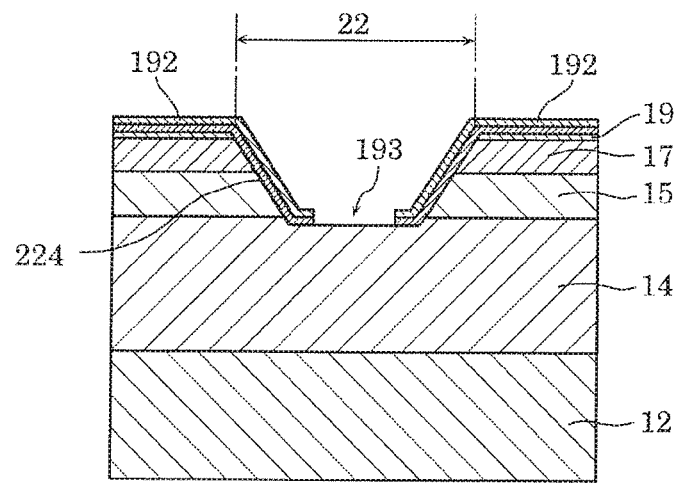
FIG. 7C is a cross-sectional view illustrating a process of etching a high-resistance layer in a method of manufacturing the nitride semiconductor device according to Embodiment 2.

Next, high-resistance layer 224 is formed by partially removing GaN film 223 through dry etching, as illustrated in FIG. 7C. The part from which high-resistance layer 224 has been removed serves as a path for current to flow between drain electrode 36 and source electrode 34 via electron transport layer 26.

Note that the part of high-resistance layer 224 provided on the upper surface of undoped AlGaN film 19 may be removed. In other words, the upper surface of undoped AlGaN film 19 may be exposed in the same manner as in Embodiment 1.

Figure 7D:
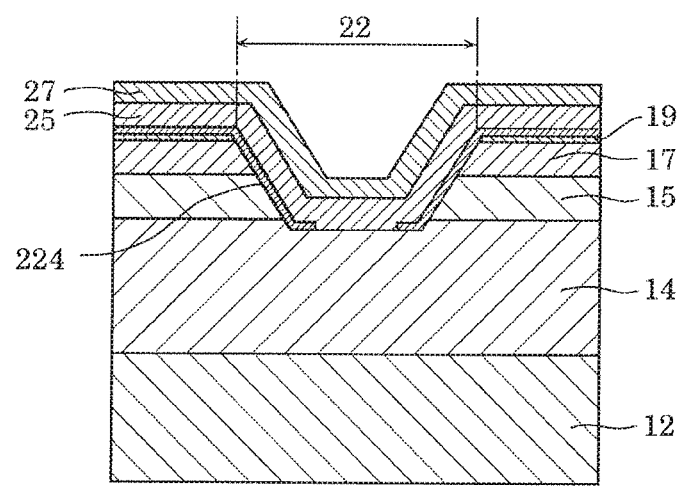
FIG. 7D is a cross-sectional view illustrating a nitride semiconductor regrowth process in the method of manufacturing the nitride semiconductor device according to Embodiment 2.

Next, after resist mask 192 has been removed, undoped GaN film 25, an undoped AlN film (not shown), and undoped AlGaN film 27 are formed, in that order, through MOVPE, across the entire surface of and following the shape of, gate opening 22, as illustrated in FIG. 7D. Undoped GaN film 25 and undoped AlGaN film 27 are patterned into predetermined shapes to become electron transport layer 26 and electron supply layer 28, respectively.

The layers have substantially uniform thicknesses, which are as follows, for example. Undoped GaN film 25 is 100 nm thick. Undoped AlN film is 1 nm thick. Undoped AlGaN film 27 is 50 nm thick. Note, however, that these numerical values are merely examples.

Note that high-resistance layer 224 is formed from a nitride semiconductor, and thus the film properties provided by the regrowth of undoped GaN film 25, the undoped AN film (not shown), and undoped AlGaN film 27 are improved.

Figure 7E:
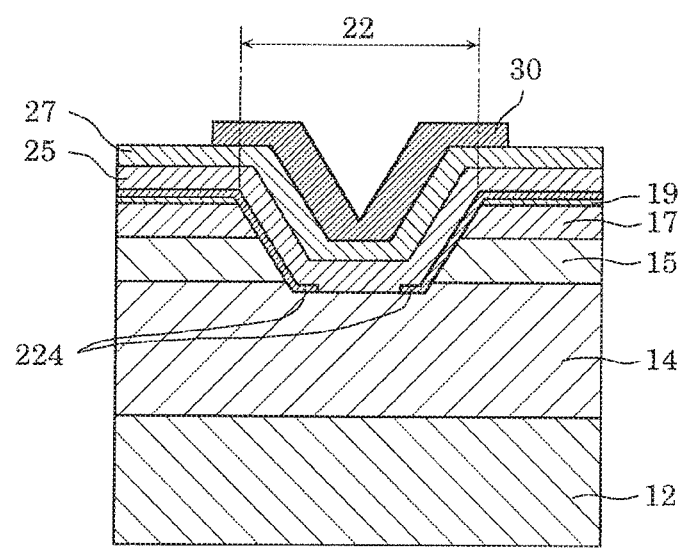
FIG. 7E is a cross-sectional view illustrating a process of forming a gate electrode in the method of manufacturing the nitride semiconductor device according to Embodiment 2.

Next, a gate metal film constituted by Pd is formed through vapor deposition or sputtering so as to cover gate opening 22. As illustrated in FIG. 7E, gate electrode 30 is formed by patterning the gate metal film which has been formed.

Furthermore, source opening 32, which penetrates through undoped AlGaN film 27, the undoped AlN film (not shown), undoped GaN film 25, undoped AlGaN film 19, and undoped GaN film 17, and reaches as far as p-type GaN film 15, is formed in a location distanced from gate electrode 30. Like gate opening 22, source opening 32 is formed through photolithography and dry etching. Electron supply layer 28, electron transport layer 26, third base layer 20, second base layer 18, and first base layer 16 are formed by patterning undoped AlGaN film 27, undoped GaN film 25, undoped AlGaN film 19, undoped GaN film 17, and p-type GaN film 15, respectively.

Next, source electrode 34 is formed by forming a source metal film constituted by Ti and Au through vapor deposition or sputtering so as to fill source opening 32 and then patterning the source metal film. Furthermore, drain electrode 36 is formed by forming a drain metal film constituted by Ti and Al on second main surface 12b of substrate 12 through vapor deposition or sputtering and then patterning the drain metal film as necessary.

Nitride semiconductor device 210 illustrated in FIG. 6 is formed through the processes described above.

Variation

A variation on nitride semiconductor device 210 according to the present embodiment will be described next with reference to FIG. 8.

Figure 8:
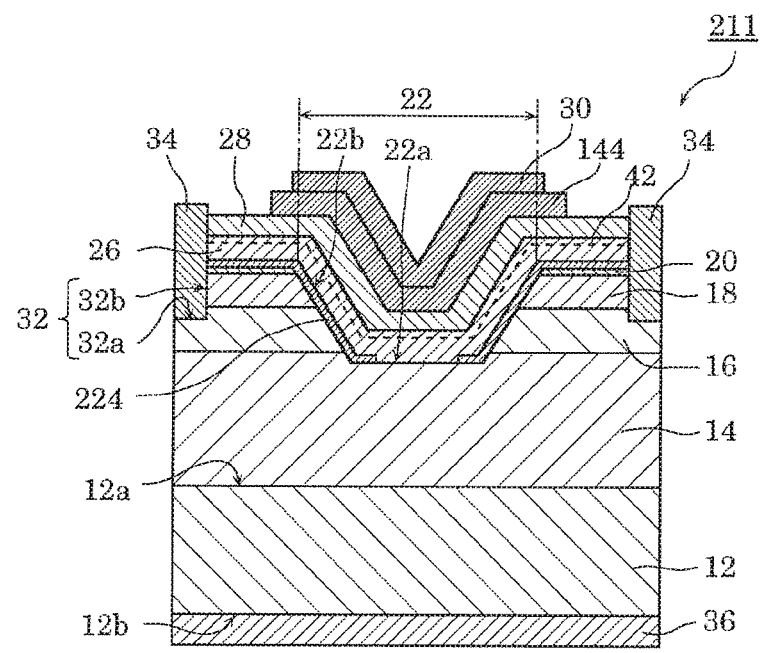
FIG. 8 is a cross-sectional view of a nitride semiconductor device according to a variation on Embodiment 2.

FIG. 8 is a cross-sectional view of nitride semiconductor device 211 according to the present variation. As illustrated in FIG. 8, nitride semiconductor device 211 differs from nitride semiconductor device 210 illustrated in FIG. 6 in that threshold control layer 144 is provided. The following descriptions will focus on the differences from the embodiment, and descriptions of common points will be omitted or simplified.

Threshold control layer 144 is an example of a third nitride semiconductor layer of the second conductivity type, provided between gate electrode 30 and electron transport layer 26, and is the same as threshold control layer 144 according to the variation on Embodiment 1.

Therefore, according to the present variation, threshold control layer 144 increases the potential at the end of the conducting band of the channel part. This makes it possible to increase the threshold voltage of nitride semiconductor device 211. Accordingly, nitride semiconductor device 211 can be implemented as a normally-off FET.

Other Embodiments

Although one or more aspects of a nitride semiconductor device have been described thus far on the basis of embodiments, the present disclosure is not intended to be limited to these embodiments. Variations on the present embodiment conceived by one skilled in the art and embodiments implemented by combining constituent elements from different other embodiments, for as long as they do not depart from the essential spirit thereof, fall within the scope of the present disclosure.

For example, although the foregoing embodiments describe examples in which the first conductivity type is the n-type and the second conductivity type is the p-type, the conductivity types are not limited thereto. The first conductivity type may be the p-type and the second conductivity type may be the n-type.

Additionally, high-resistance layer 24 or 224 may be provided only between electron transport layer 26 and first base layer 16. For example, high-resistance layer 24 or 224 may be provided only in part of side wall part 22b of gate opening 22, and need not cover the end surfaces of second base layer 18 and third base layer 20.

Additionally, seen in plan view, the end parts of gate electrode 30 may be flush with the end parts of gate opening 22, for example. Alternatively, seen in plan view, gate electrode 30 may be provided on an inner side of gate opening 22.

Additionally, although source opening 32 is provided so as to reach as far as first base layer 16 in the foregoing embodiments, for example, the opening is not limited thereto. For example, source opening 32 may be an opening that reaches as far as electron transport layer 26, and source electrode 34 may be connected to electron transport layer 26 but not connected to first base layer 16.

Additionally, many changes, substitutions, additions, omissions, and the like are possible for the foregoing embodiments without departing from the scope of the claims or a scope equivalent thereto.

INDUSTRIAL APPLICABILITY

The present disclosure can be used as a nitride semiconductor device which suppresses leakage current, and can therefore be used in power transistors and the like employed in power circuitry of consumer devices such as televisions.

What is claimed is:

1. A nitride semiconductor device, comprising:
a substrate having a first main surface and a second main surface which face in opposite directions;
a first nitride semiconductor layer of a first conductivity type provided above the first main surface;
a second nitride semiconductor layer of a second conductivity type provided above the first nitride semiconductor layer, the second conductivity type being different from the first conductivity type;
a first opening which penetrates through the second nitride semiconductor layer to the first nitride semiconductor layer;
an electron transport layer provided above the second nitride semiconductor layer and on an inner surface of the first opening;
a gate electrode provided above the electron transport layer and covering the first opening;
a source electrode connected to the second nitride semiconductor layer;
a drain electrode provided on a second main surface-side of the substrate;
a high-resistance layer provided between the second nitride semiconductor layer and the electron transport layer in the first opening, the high-resistance layer including a nitride semiconductor and having a higher resistance value than the second nitride semiconductor layer; and
wherein the high resistance layer has a third opening at a bottom surface of the first opening.

2. The nitride semiconductor device according to claim 1, wherein the high-resistance layer contains iron.

3. The nitride semiconductor device according to claim 1, wherein the high-resistance layer contains carbon.

4. The nitride semiconductor device according to claim 3, wherein a carbon concentration of the high-resistance layer is higher than a carbon concentration of the electron transport layer.

5. The nitride semiconductor device according to claim 1, wherein the first opening includes a bottom part and a side wall part, and
the high-resistance layer extends from the side wall part to a part of the bottom part.

6. The nitride semiconductor device according to claim 1, further comprising:
a third nitride semiconductor layer provided between the gate electrode and the electron transport layer and having the second conductivity type.

7. The nitride semiconductor device according to claim 1, wherein when the substrate is viewed in plan view, an end part of the gate electrode is located at a position closer to the source electrode than an end part of the first opening.

8. The nitride semiconductor device according to claim 1, further comprising:
a second opening at a position distanced from the gate electrode, the second opening penetrating through the electron transport layer to the second nitride semiconductor layer,
wherein the source electrode is provided in the second opening.

* * * * *